(12) United States Patent
Fernandez et al.

(10) Patent No.: US 8,779,805 B1
(45) Date of Patent: Jul. 15, 2014

(54) OUTPUT DRIVER HAVING IMPROVED SWITCHING DELAY AND ASSOCIATED METHODS

(71) Applicants: Devon Fernandez, Londonderry, NH (US); Mathew Drouin, Manchester, NH (US)

(72) Inventors: Devon Fernandez, Londonderry, NH (US); Mathew Drouin, Manchester, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 13/727,149

(22) Filed: Dec. 26, 2012

(51) Int. Cl.
*H03K 3/00* (2006.01)

(52) U.S. Cl.
USPC .......................................... 327/108; 327/170

(58) Field of Classification Search
USPC .................................................. 327/108, 170
See application file for complete search history.

(56) References Cited

U.S. PATENT DOCUMENTS

| | | | |
|---|---|---|---|
| 4,540,893 A * | 9/1985 | Bloomer | 327/432 |
| 5,594,369 A * | 1/1997 | Kondoh et al. | 326/83 |
| 5,668,449 A | 9/1997 | Carobolante | |
| 5,670,894 A * | 9/1997 | Takaishi et al. | 326/27 |
| 6,208,177 B1 * | 3/2001 | Knoedl, Jr. | 327/108 |
| 6,222,403 B1 * | 4/2001 | Mitsuda | 327/170 |
| 6,411,120 B1 | 6/2002 | Hung et al. | |
| 2002/0153928 A1 | 10/2002 | Zerilli et al. | |

OTHER PUBLICATIONS

Fernandez; "Open Drain Output Delay Reduction;" Allegro Microsystems, Inc.; Sep. 15, 2012; 3 pages.
PCT Search Report and Written Opinion of the ISA dated Mar. 13, 2014; for PCT Pat. App. No. PCT/US2013/017765; 11 pages.
Fernandez; "Modulated Digital Sensor Temperature Compensation;" Allegro Microsystems, Inc.; May 22, 2012; pp. 6-10.
U.S. Appl. No. 13/653,824, Oct. 17, 2012, Eagen.

\* cited by examiner

*Primary Examiner* — Kenneth B. Wells
(74) *Attorney, Agent, or Firm* — Daly, Crowley, Mofford & Durkee, LLP

(57) ABSTRACT

A switching device for driving a load is provided. The switching device comprises a control terminal and has a conduction threshold which, when crossed by a control signal coupled to the control terminal, causes the switching device to conduct. A control circuit for generating the control signal is also provided. The control circuit is configured to generate a control signal having a first slew rate prior to the control signal crossing the conduction threshold and a second slew rate after the control signal has crossed the conduction threshold. The first slew rate may be faster than the second slew rate.

19 Claims, 8 Drawing Sheets

OUTPUT DRIVER HAVING IMPROVED SWITCHING DELAY AND ASSOCIATED METHODS

FIELD

Subject matter disclosed herein relates generally to integrated circuits and, more particularly, to techniques and circuits for reducing switching delay of output driver circuits.

BACKGROUND

Industry standards, such as FCC or automotive standards, often require radiated electromagnetic emissions of a circuit to fall below certain limits. Adjusting the switching time of a switch can reduce radiated electromagnetic emissions associated with an output signal of the switch. Some switch circuits reduce the switching time by slowing down the rise or fall of a control signal.

Consider an output driver comprising a field-effect transistor (FET) acting as a switch in a common source configuration. A control signal at the gate of the FET causes the FET to turn on or off, effectively coupling the output (at the drain) to the source. Slowing the rise or fall of the control signal at the gate can slow the switching time of the FET, and thus reduce radiated emissions. However, slowing the rise or fall of the control signal can also cause an undesirable switching delay.

SUMMARY

A switching device for driving a load is provided. The switching device comprises a control terminal and has a conduction threshold which, when crossed by a control signal coupled to the control terminal, causes the switching device to conduct. A control circuit for generating the control signal is also provided. The control circuit is configured to generate a control signal having a first slew rate prior to the control signal crossing the conduction threshold and a second slew rate after the control signal has crossed the conduction threshold. The first slew rate may be faster than the second slew rate.

BRIEF DESCRIPTION OF THE DRAWINGS

The foregoing features may be more fully understood from the following description of the drawings in which.

Like figures in the drawings may represent like elements.

DETAILED DESCRIPTION

Figure 1:
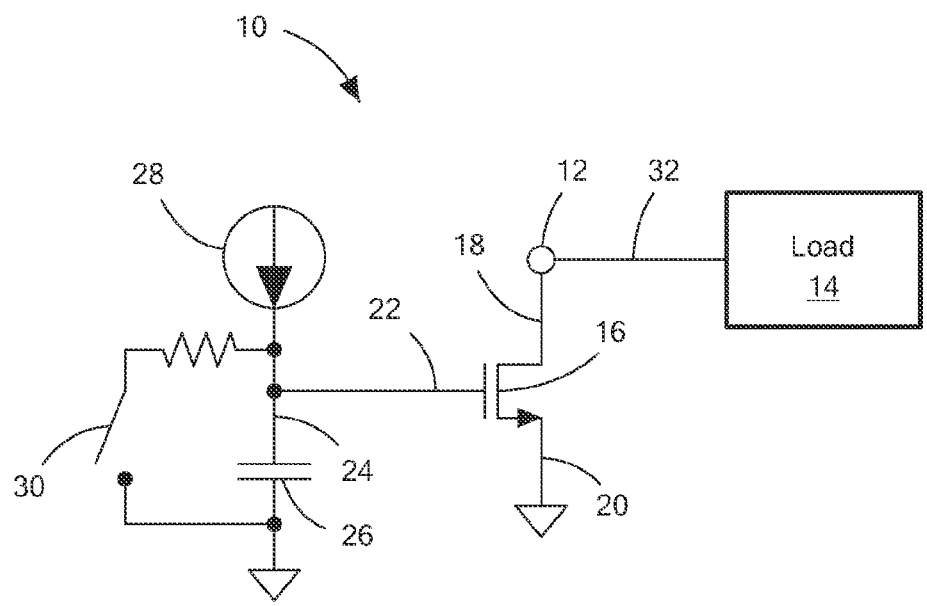
FIG. 1 is a schematic diagram illustrating a conventional output driver circuit.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, a magnetic field sensor that uses a backbias field to sense a ferrous target, and a magnetic field sensor that senses a magnetic field density of a magnetic field.

Magnetic field sensors often include driver circuits that can drive an output signal of the magnetic field sensor. These driver circuits often produce an output signal that switches between a high and low signal level when the magnetic field sensor senses a magnetic target. In some cases, depending upon the location where the magnetic field sensor is installed, the driver circuit may have to drive the output signal across a long wire or cable harness. For example, if the magnetic field sensor is installed in a vehicle's transmission (e.g. on a camshaft), the wire harness running from the magnetic field sensor to a central processor may be a few feet or a few meters in length. Such a long cable may act like an antenna. For example, if a driver circuit drives a signal across the long cable, the cable may radiate electromagnetic emissions. Such emissions are undesirable, especially if the long cable is installed in close proximity to other circuits or conductors onto which the radiated emissions can couple.

FIG. 1 is a schematic diagram of an electronic circuit 10 of the prior art. The electronic circuit may have an output terminal 12 coupled to a load 14. In this example, the load 14 may include a pull-up resistor. A transistor 16 is configured in a common-source configuration with a drain terminal 18 coupled to the output terminal 12 and a source terminal 20 coupled to ground. A gate terminal 22 of the transistor 16 is coupled to a terminal 24 of a capacitor 26. The other terminal of the capacitor is coupled to ground. A current source 28 coupled to the terminal 24 of the capacitor can charge the capacitor. A switch 30 is shown coupled between the terminal 24 and ground.

In operation, the current source 28 charges the capacitor 26. When the voltage across the capacitor 26 reaches a threshold voltage of the switch, the transistor 16 conducts and the output terminal 12 approaches ground. Once the capacitor 26 is charged, the switch 30 can be closed to discharge the capacitor 26. This turns the transistor 16 off so that the load 14 can pull the voltage at the output terminal 12 high. By charging and discharging the capacitor 26, the electronic circuit 10 can generate an alternating voltage at the output terminal 12. This alternating voltage can be used as an output of the circuit 10.

The rate at which the transistor 16 switches can affect electromagnetic emissions produced by the circuit 10. For example, as the voltage at the output terminal 12 switches, a conductor 32 coupled between the output terminal 12 and the load 14 may act like an antenna. The alternating voltage waveform on the conductor 32 may cause radiated electromagnetic emissions.

In many cases, it is desirable to limit the electromagnetic emissions produced by the electronic circuit 10. Certain compliance standards, such as certain FCC standards or automotive standards, require electromagnetic emissions to be within certain levels. In order to comply with such standards, the amount of current sourced by current source 28 can be controlled. If, for example, the current source 28 produces a relatively low current, the capacitor 26 may charge up relatively slowly. This may result in a slower rise or fall time of the voltage waveform (i.e. the output signal) on the conductor 32, which may result in lower radiated emissions. However, charging the capacitor 26 slowly may also result in an increased delay in the switching time of the output.

Figure 2:
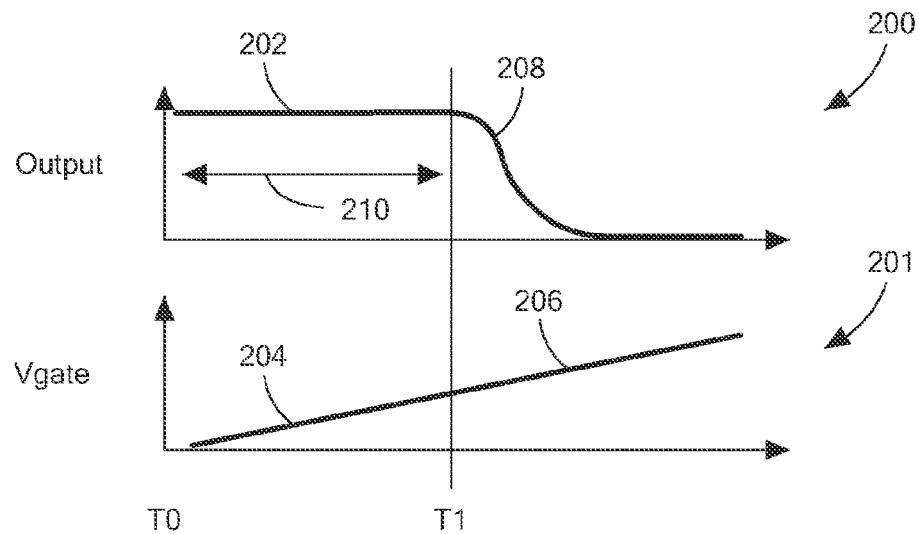
FIG. 2 is a graph illustrating the output of the driver circuit of FIG. 1.

FIG. 2 is a graph of a waveform 200 of the prior art, which represents a voltage 202 at the output terminal 12, and a waveform 201, which represents a voltage 204 at the gate terminal 22. The horizontal axis represents time. The waveform 200 also includes a switching threshold 206 of the transistor 16.

At time T0 the capacitor 26 begins to charge and the voltage 204 begins to rise. Prior to time T1, the voltage 204 is below the switching threshold 206. Accordingly, the transistor 16 is off and the voltage 202 at the output terminal 12 is high during the time period between T0 and T1.

After time T1, the voltage 204 crosses the conduction threshold 206 and the transistor begins to conduct. Since the voltage 204 is rising at a relatively slow rate, the transistor 16 can switch from off (i.e. a non-conducting state) to on (i.e. a saturation state) relatively slowly. This may result in a relatively shallow slope 208 of the output signal 202. In contrast to a steep slope, this relatively shallow slope 208 can help to reduce electrical emissions produced by the circuit 10.

However, since the voltage 204 rises relatively slowly, it causes a delay in the switching time. The transistor 16 does not begin to conduct until the voltage 204 crosses the switching threshold 206, which produces a delay 210. This delay 210 can cause inaccuracies in the data at the output terminal 12. For example, if the circuit 10 is installed in a vehicle to monitor the speed, position, or direction of a transmission, the delay 210 can result in inaccurate speed, position, or direction data produced by the electronic circuit 10.

Figure 3:
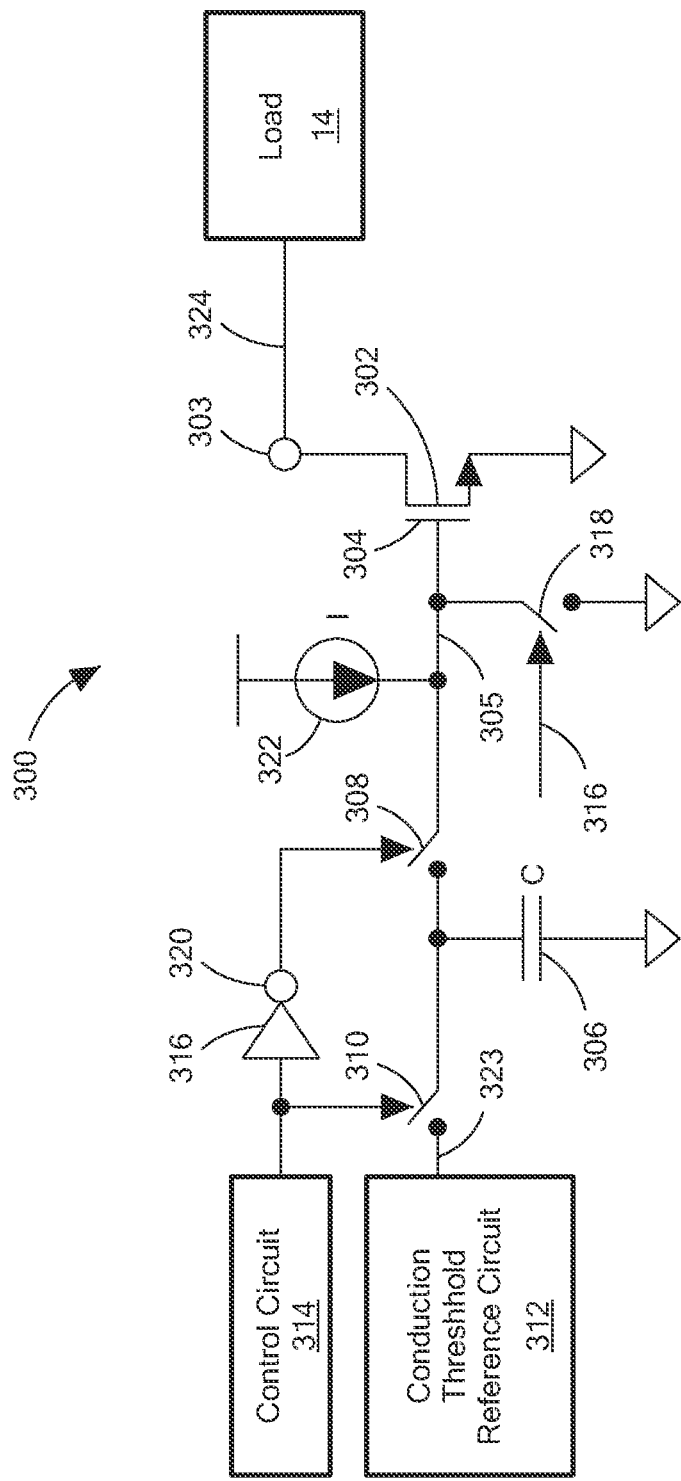
FIG. 3 is a schematic diagram of an embodiment of an output driver circuit.

FIG. 3 is a schematic diagram of an electronic circuit 300 for driving the load 14. In an embodiment, the electronic circuit 300 can be an output driver of a magnetic field sensor. As examples, a magnetic field sensor may be installed in a vehicle in order to detect the speed, position, and/or direction of, for example, a camshaft or wheel. As a magnetic target, or features of a target such as gear teeth, on or coupled to a wheel or camshaft pass the magnetic field sensor, the magnetic field sensor may drive an output to indicate a speed of rotation of the wheel or position of the camshaft, respectively. In an embodiment, the magnetic field sensor may include an output driver circuit, such as the electronic circuit 300, that can drive the output.

The electronic circuit 300 includes a switching device 302 coupled to an output terminal 303. The switching device 302 may have a control terminal 304. When a signal 305 at the control terminal 304 crosses a conduction threshold of the switching device 302 in one direction (e.g. crosses from low to high), the switching device may turn on (i.e. conduct). If the signal 305 crosses the conduction threshold in the opposite direction (e.g. crosses from high to low), the switching device 302 may turn off (i.e. stop conducting).

In FIG. 3, the switching device 302 is shown as an n-channel FET, the control terminal 304 is a gate terminal of the FET, and the control signal 305 is a voltage signal at the gate of the FET. In such an embodiment, the conduction threshold of the FET may be the FET's threshold voltage. As the voltage signal 305 at the gate crosses the FET's threshold voltage, the FET may turn on and off. However, the switching device 302 can be any type of switching device that can be controlled by a control terminal 304. For example, the switching device 302 can be an n-channel or p-channel FET, a logic gate, a BJT, a relay, etc. In an embodiment, the switching device 302 may comprise multiple switching devices. For example, the switching device 302 may include multiple FETs, logic gates, BJT, relays, etc, arranged in parallel or in series, or a combination thereof. In such an embodiment, the multiple switching devices may be controlled by a single control signal 305. Alternatively, the control signal 305 may comprise multiple control signals each controlling one or more of the switching devices.

The control signal 305 coupled to the control terminal 304 may be a voltage signal, a current signal, or any other type of signal that can control the switching device 302. Note that if the switching device 302 is a relay, the control signal 305 may be a pulsed signal, such as a PWM signal, that can cause the relay to open or close relatively slowly.

The electronic circuit 302 also includes a capacitor 306 (i.e. a type of energy storage device) that can store a charge. As the charge stored by the capacitor 306 increases, so does a voltage across the capacitor 306. The capacitor can be selectively coupled to the control terminal 304 by a switch 308. A second switch 310 can selectively couple the capacitor 306 to a conduction threshold reference circuit 312. When coupled, the conduction threshold reference circuit 312 may charge the capacitor to a voltage related to the conduction threshold of the switching device 302. In some embodiments, the conduction threshold reference circuit 312 may charge the capacitor approximately to the level of the switch conduction threshold. In other embodiments, the conduction threshold reference circuit 312 may charge the capacitor to a level slightly higher or lower than the switch conduction threshold.

A control circuit 314 provides a control signal 316 that is coupled to the switches 310 and 318. The switch control signal 316, when asserted by the control circuit, can open and close the switches 310 and 318. The switch control signal 316 can also open and close the switch 308, which is responsive to an inverted version of the control signal 316 provided by an inverter 320. Because of the inverter 320, the switch 308 may be open when the switch 310 is closed, and vice versa. In embodiments, the switches 310, 308, and 318 may be electronic switches, transistors, electromechanical switches, mechanical switches, or any other type of switch that can make and/or break an electrical connection.

A current source 322 is coupled to the control terminal 304, and can be selectively coupled to the capacitor 306 by the switch 308.

In operation, the conduction threshold reference circuit 312 may produce a reference voltage signal 323. The reference voltage signal 323 may be associated with a conduction threshold of the switching device 302. For example, in some embodiments, the reference voltage signal 323 may be approximately equal to the switch conduction threshold. In other embodiments, the reference voltage signal 323 may be higher or lower than the conduction threshold of the switching device 302 as desired.

If, in one embodiment, the switching device 302 begins to conduct at the switching threshold but does not turn completely on until the voltage at the control terminal 304 reaches a level slightly higher than the conduction threshold, then the reference voltage signal 323 may be set to that voltage that turns the switching device 302 completely on. Alternatively, the reference voltage signal 323 may be set to a voltage level that is near the conduction threshold, but does not turn the switching device 302 on.

When the control circuit 314 asserts the control signal 316, the switch 310 may close and couple the capacitor 306 to the conduction threshold reference circuit 312. The inverter 320 inverts the control signal 316 so that that the switch 308 opens and decouples the capacitor 306 from the control terminal 304. The control signal 316 also closes the switch 318 so that the control terminal 304 is coupled to ground. Since the control terminal 304 is coupled to ground, the switching device 302 is in a non-conducting state and the voltage at the output terminal 303 may be pulled high by the load 14.

While the capacitor 306 is coupled to the conduction threshold reference circuit 312, the conduction threshold reference circuit 312 may charge the capacitor 306 until the voltage across the capacitor 306 is substantially equal to the value of the reference voltage signal 323. If, prior to being coupled to the conduction threshold reference circuit 312, the voltage across the capacitor 306 is greater than the voltage reference signal 312, then the conduction threshold reference circuit 312 may sink current from (i.e. discharge) the capacitor 306 until the voltage across the capacitor 306 is equal to the voltage reference signal 323. If the voltage across the capacitor 306 is lower than the voltage reference signal 323, then the conduction threshold reference circuit 312 may source current to (i.e. charge) the capacitor 306 until the voltage across the capacitor 306 is equal to the voltage reference signal 323.

When the control circuit 314 de-asserts the control signal 316, the switch 308 may couple the capacitor 306 (now charged to the level of the conduction threshold) to the control terminal 304. The switch 318 and the switch 310 may also open so that the control terminal 304 is decoupled from ground, and the capacitor 306 is decoupled from the conduction threshold reference circuit 312.

Closing the switch 308 and coupling the capacitor 306 to the control terminal 304 may quickly ramp the voltage at the control terminal 304 up to the same or similar level as the voltage across the capacitor 306, i.e. the same or similar level as the voltage reference signal 323. In an embodiment, if the voltage across the capacitor 306 is equal to the conduction threshold, then coupling the capacitor 306 to the control terminal 304 will quickly bring the voltage at the control terminal 304 up to the level of the conduction threshold. If the capacitor 306 is charged to a level that is close to or on the verge of the conduction threshold, then coupling the capacitor to the control terminal 304 may place the switching device on the verge of turning on. Quickly ramping the voltage at the control terminal 304 to, or near to, the level of the conduction threshold in this way may reduce switching delay, which will be discussed below.

With the switch 310 open and the switch 308 closed, the current source 322 is coupled to the capacitor 306 and can continue charging the capacitor 306. As the capacitor 306 continues to charge, the voltage across the capacitor 306 (and thus the voltage at the control terminal 304) will rise to a level greater than the conduction threshold. As the voltage at the control terminal 304 rises above the conduction threshold, the switching device 302 may turn on and begin to conduct, thus pulling the voltage at the output terminal 303 to ground.

In an embodiment, the current source 322 may be configured to charge the capacitor 306 relatively slowly. Thus, the voltage at the control terminal 304 may rise relatively slowly and the switching device 302 may switch from a non-conducting state to a conducting state relatively slowly. This can result in a relatively slow falling slew rate of the voltage at the output terminal 303, which may reduce radiated emissions caused by the change in voltage at the output terminal 303. The rate at which the current source 322 charges the capacitor can be set to an appropriate rate depending upon the design requirements of the circuit 300. In an embodiment, the current source 322 may be a variable current source that can be adjusted during manufacturing and/or during operation.

Figure 3A:
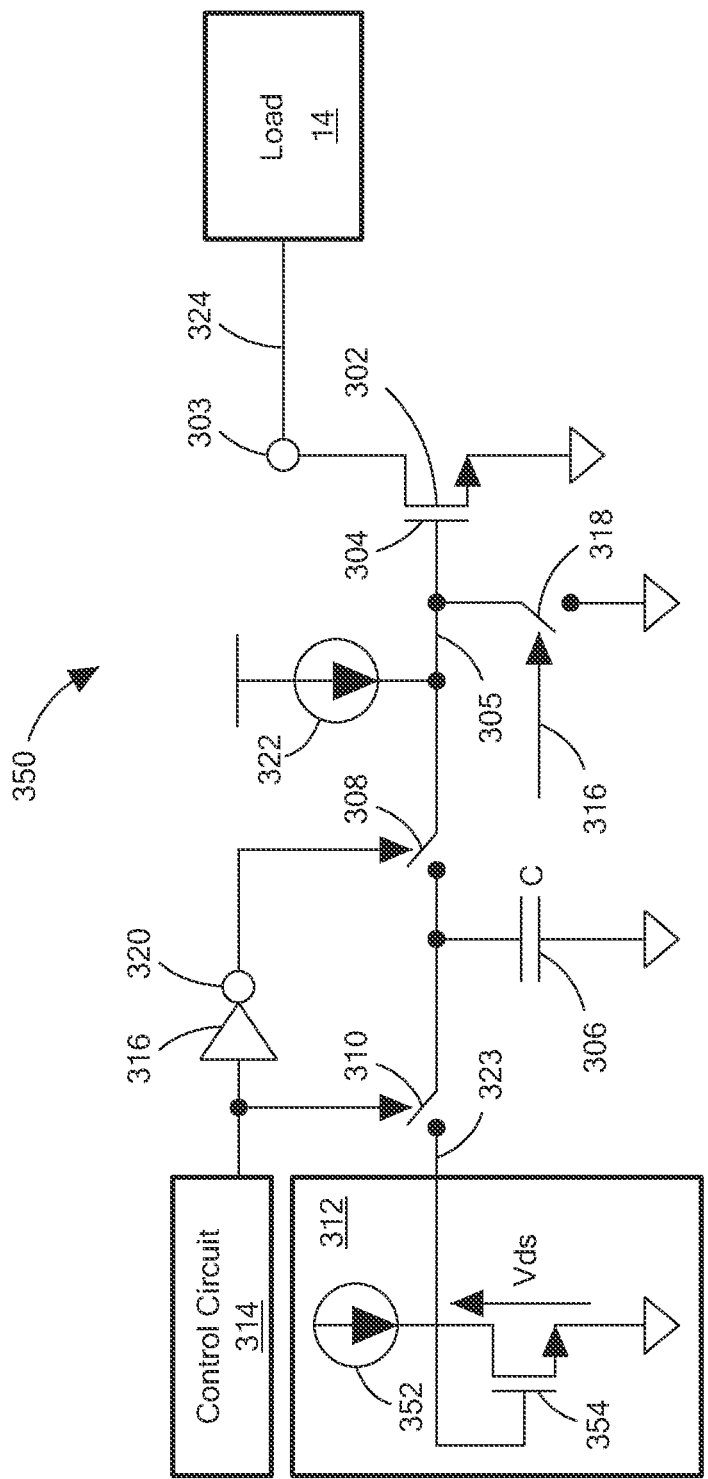
FIG. 3A is a schematic diagram of an embodiment of an output driver circuit.

FIG. 3A is a schematic diagram of an electronic circuit 350 for driving the load 14. The electronic circuit 350 may be the same as or similar to, or may be an alternate embodiment of the electronic circuit 300 in FIG. 3.

As shown, the conduction threshold reference circuit 312 may include a current source 352 and a transistor 354. The gate terminal of the transistor 354 may be coupled to the drain terminal of the transistor 354 so that, as current flows from the current source 352 through the transistor 354 to ground, the voltage across the transistor (i.e. the Vds voltage) is equal to the threshold voltage of the transistor 354. When charging the capacitor 306, if the voltage across the capacitor 306 is greater than the threshold voltage, then the transistor 354 will sink current from the capacitor 306 until the voltage across the capacitor is equal to the threshold voltage. Similarly, if the voltage across the capacitor 306 is less than the Vds voltage, then the current source 352 will charge the capacitor until the voltage across the capacitor 306 is equal to the threshold voltage.

In an embodiment, the transistor 354 may be the same type of transistor as the transistor 302. In such an embodiment, the Vds voltage of the transistor 354 will be substantially equal to the threshold voltage (i.e. the conduction threshold) of the transistor 302. Thus, when the capacitor 306 is coupled to the transistor 354, the capacitor 206 will be charged to a voltage level substantially equal to the conduction threshold of the transistor 302.

In other embodiments, the conduction threshold reference circuit 312 may include voltage dividers, reference voltages, voltage regulators, or other circuits that can charge the capacitor 306 to a voltage associated with the conduction threshold of the switching device 302.

Figure 3B:
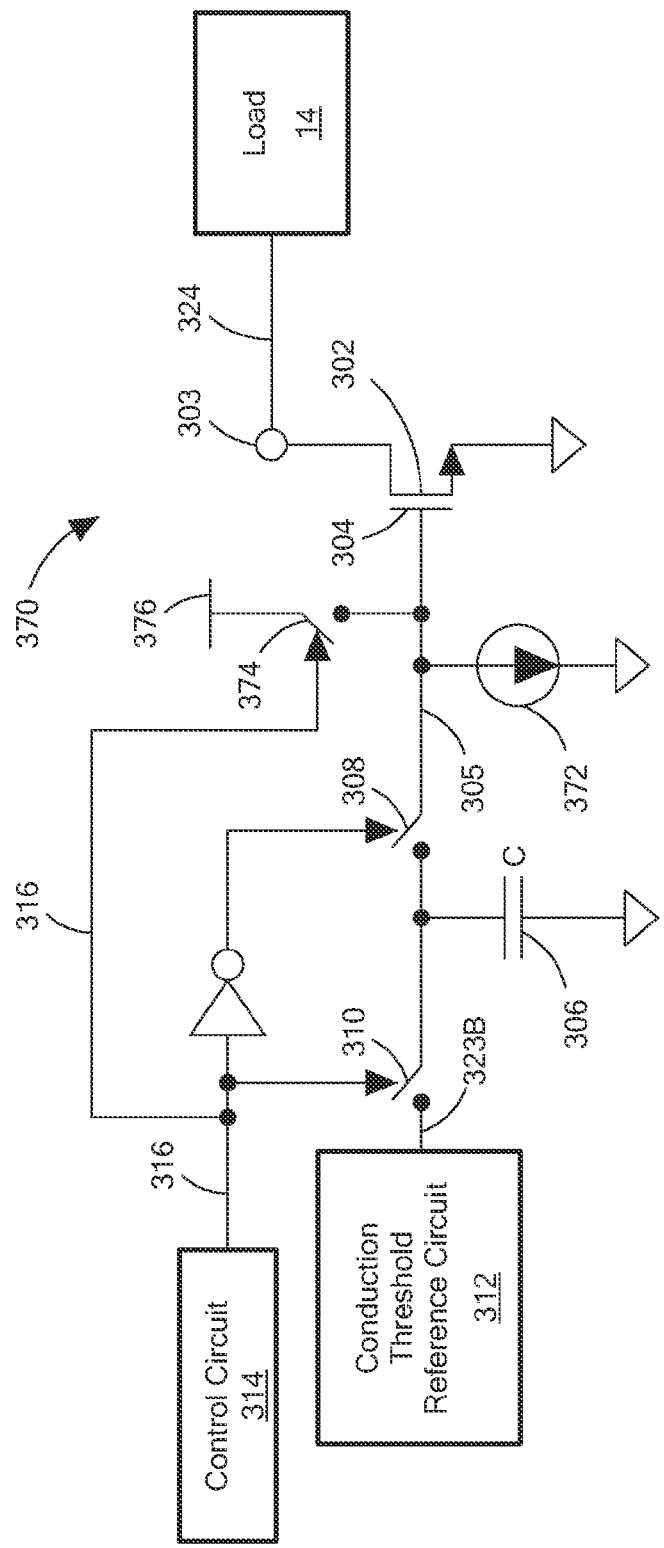
FIG. 3B is a schematic diagram of an embodiment of an output driver circuit.
Figure 3C:
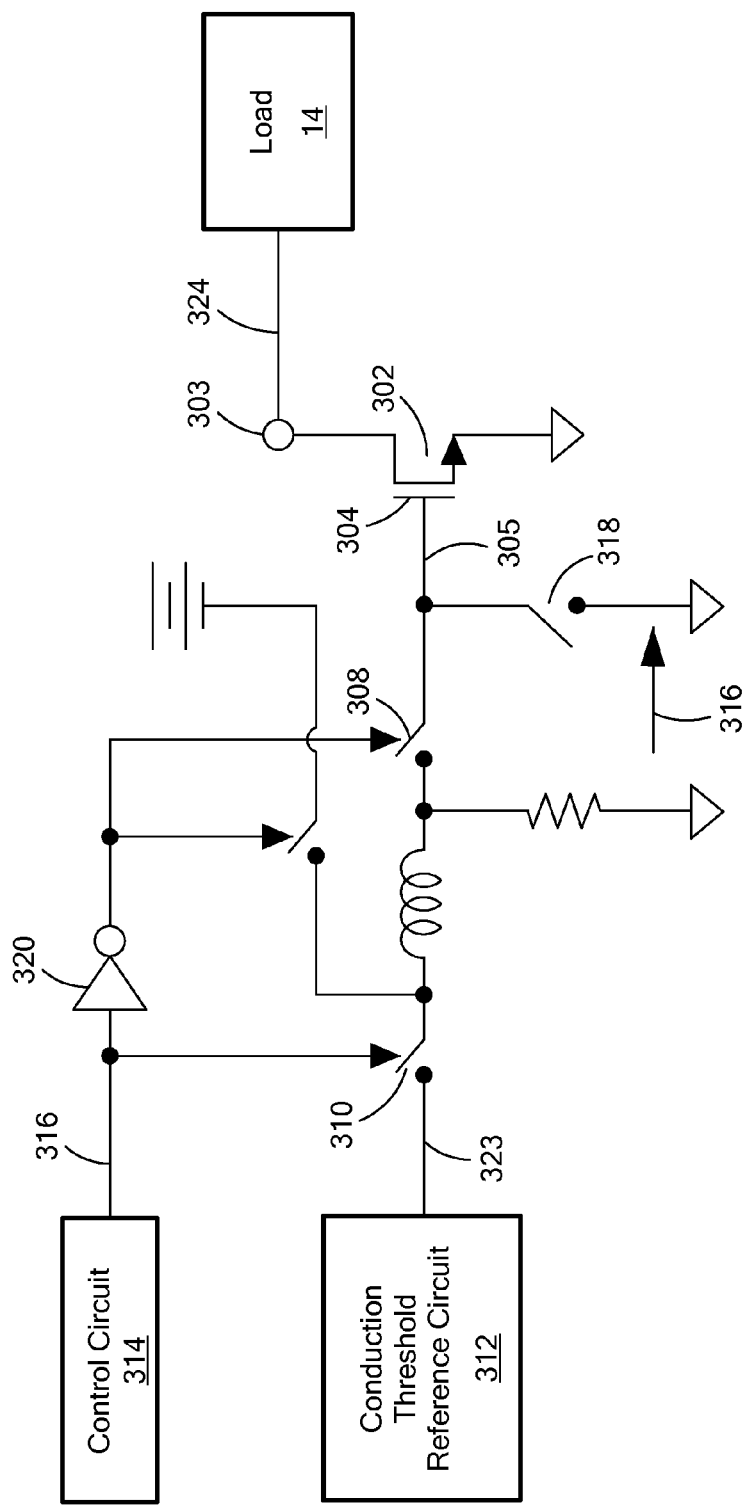
FIG. 3C is a schematic diagram of an embodiment of an output driver circuit.

FIG. 3B is a schematic diagram of an electronic circuit 370 for driving the load 14. The electronic circuit 370 may be the same as or similar to, or may be an alternate embodiment of the electronic circuit 300 in FIG. 3.

The electronic circuit 370 may be configured to use the capacitor 306 to generate a falling edge of the signal 305. In the electronic circuit 370, a current source 372 is coupled to sink current from the capacitor 306 when the switch 308 is closed. In an embodiment, the current source 372 can be a variable current source. Adjusting the current supplied by the current source 372 can change the slew rate of the voltage across the capacitor 306. Also, a switch 374 is coupled between the control terminal 304 and a voltage source 376 so that, when the switch 374 is closed, the control terminal 304 is coupled to the voltage source 376. In an embodiment, the voltage source 376 may provide a voltage sufficient to turn the switching device 302 on when applied to the control terminal 304.

In operation, when the control circuit 314 asserts the control signal 316, the switches 310 and 374 close, and the switch 308 opens. As the switch 310 closes and the switch 308 opens, the capacitor 306 is coupled to the conduction threshold reference circuit 312, which charges the capacitor 306 to the level associated with the switch conduction threshold. As the switch 374 closes it couples the control terminal 304 to the voltage source 376, thus turning the switching device 302 on and pulling the voltage at the output terminal 303 to ground.

When the control circuit 314 de-asserts the control signal 316, the switches 310 and 374 open, and the switch 308 closes. As the switch 374 opens, the control terminal 304 is decoupled from the voltage source 376. As the switch 308 closes, the capacitor 306 (now charged to the level associated with the switch conduction threshold) is coupled to the control terminal 304. Coupling the capacitor 306 to the control terminal 304 ramps the voltage at the control terminal 304 down from the voltage of the voltage source 376 to near the level of the conduction threshold. In an embodiment, the capacitor 306 can be charged to a level slightly higher than the conduction threshold so that, when the capacitor 306 is coupled to the control terminal 304, the switching device 302 is brought to the verge of switching but does not yet turn off. The current source 372 may then begin to discharge the capacitor 306, thus ramping the voltage at the control terminal 304 down at a relatively slow rate to turn the switching device 302 off. Using the current source 372 to discharge the capacitor 306 at a slow rate may slow the transition of the switching device 302 from an on state to an off state. This may reduce the slew rate of the voltage at the output terminal 303 and reduce electrical emissions radiated by the electronic circuit 370.

In an embodiment, the conduction threshold reference circuit 312 produces a voltage reference signal 323B that charges the capacitor 306 to a level above (or, if desired, below) the conduction threshold so that, when the capacitor 306 is coupled to the control terminal 304, the switching device 302 is quickly brought to the verge of switching to reduce delay prior to switching. The current source (current source 372 in FIG. 3B or current source 322 in FIG. 3) can then continue to charge or discharge the capacitor 306 at a relatively slower rate so that the switching device 302 begins to conduct relatively slowly.

Figure 4A:
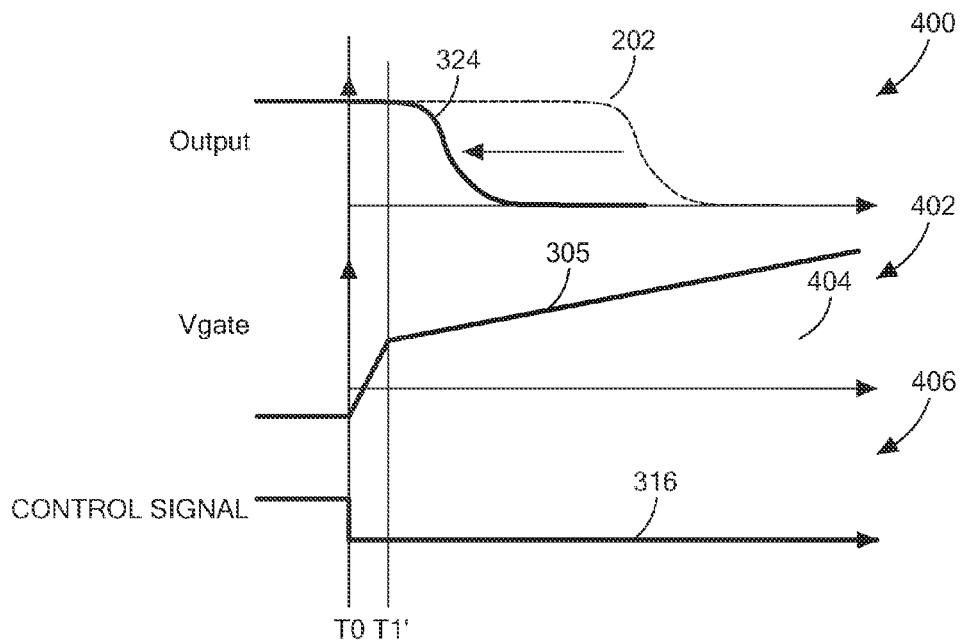
FIG. 4A is a graph of signals that may be produced by embodiments of an output driver circuit shown in FIG. 3 or FIG. 3A.

FIG. 4A is a graph showing waveforms that may be generated by the circuit 300 in FIG. 3 (or the electronic circuit 350 in FIG. 3A). In FIG. 4A, the vertical axes represent voltage and the horizontal axis represents time. Waveform 400 shows the output signal 324 at the output terminal 303. Waveform 400 also displays the output signal 202 produced by the prior art circuit 10 (see FIGS. 1 and 2). Waveform 402 displays the signal 305 (i.e. the voltage at the control terminal 304) and the conduction threshold 404 of the switching device 302. Waveform 406 illustrates the control signal 316 produced by the control circuit 314.

Prior to time T0, the control signal 316 is asserted. Also prior to time T0, the capacitor 306 is coupled to the conduction threshold reference circuit 312 and the signal 305 is pulled to ground by the closed switch 316.

At time T0, the control circuit 314 de-asserts the control signal 316, which opens the switches 310 and 318 and closes the switch 308 to couple the capacitor 306 the control terminal 304. Because the capacitor 306 is charged to the level associated with the conduction threshold 404, coupling the capacitor 306 to the control terminal 304 quickly ramps the signal 305 up to the level of the conduction threshold, as shown between times T0 and T1'. This quickly places the switching device 302 on the verge of switching and reduces the switching delay 210 shown in FIG. 2.

After the signal 305 ramps to the conduction threshold, the current source 322 continues to charge the capacitor 306, which continues to increase the level of the signal 305 beyond the conduction threshold 404 at a relatively slower rate, as shown in waveform 402 after time T1'. As the signal 305 increases beyond the conduction threshold, the switching device 302 turns on and pulls the output signal 324 low.

Figure 4B:
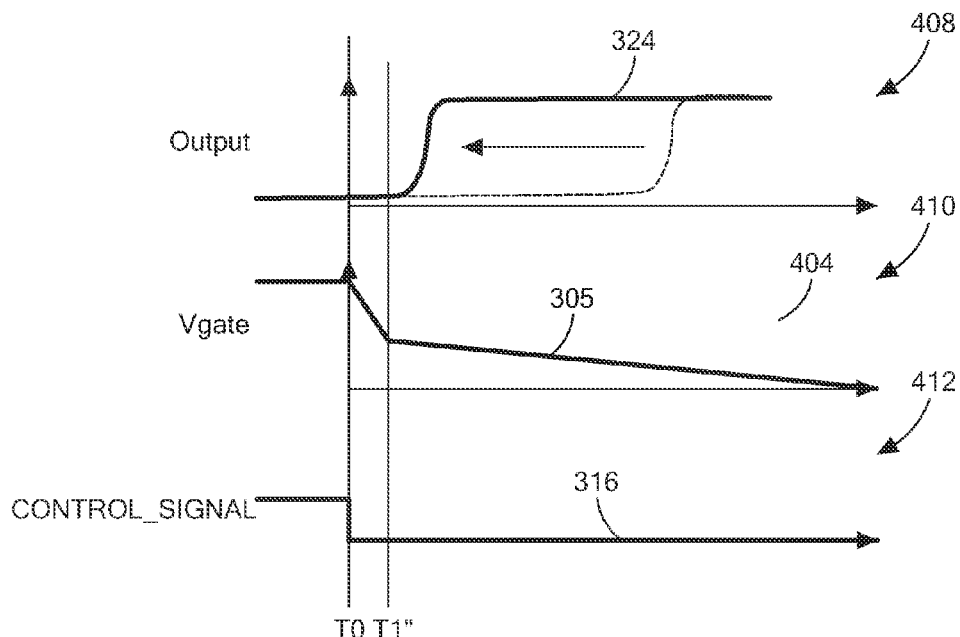
FIG. 4B is a graph of signals that may be produced by embodiments of an output driver circuit shown in FIG. 3B.

FIG. 4B is a graph showing waveforms that may be generated by the circuit 370 in FIG. 3B. In FIG. 4B, the vertical axes represent voltage and the horizontal axis represents time. Waveform 408 shows the output signal 324 at the output terminal 303. Waveform 410 displays the signal 305 (i.e. the voltage at the control terminal 304) and the conduction threshold 404 of the switching device 302. Waveform 412 displays the control signal 316 produced by the control circuit 314.

Prior to time T0, the control signal 316 is asserted. Also prior to time T0, the capacitor 306 is coupled to the conduction threshold reference circuit 312 and the signal 305 is pulled high by the switch 374.

At time T0, the control circuit 314 de-asserts the control signal 316, which opens the switches 210 and 374 and closes the switch 308 to couple the capacitor 306 the control terminal 304. Because the capacitor 306 is charged to the level associated with the conduction threshold 404, coupling the capacitor 306 to the control terminal 304 quickly ramps the signal 305 down to the level associated with the conduction threshold 404, as shown between times T0 and T1". This quickly places the switching device 302 on the verge of switching and reduces the switching delay as compared to conventional configurations.

After the signal 305 ramps to the level associated with the conduction threshold 404, the current source 372 continues to discharge the capacitor 306, which continues to decrease the level of the signal 305 below the conduction threshold 404 at a relatively slower rate, as shown in waveform 410 after time T1". As the signal 305 decreases below the conduction threshold, the switching device 302 turns off and allows the output signal 324 to be pulled high by the load 14.

Figure 5:
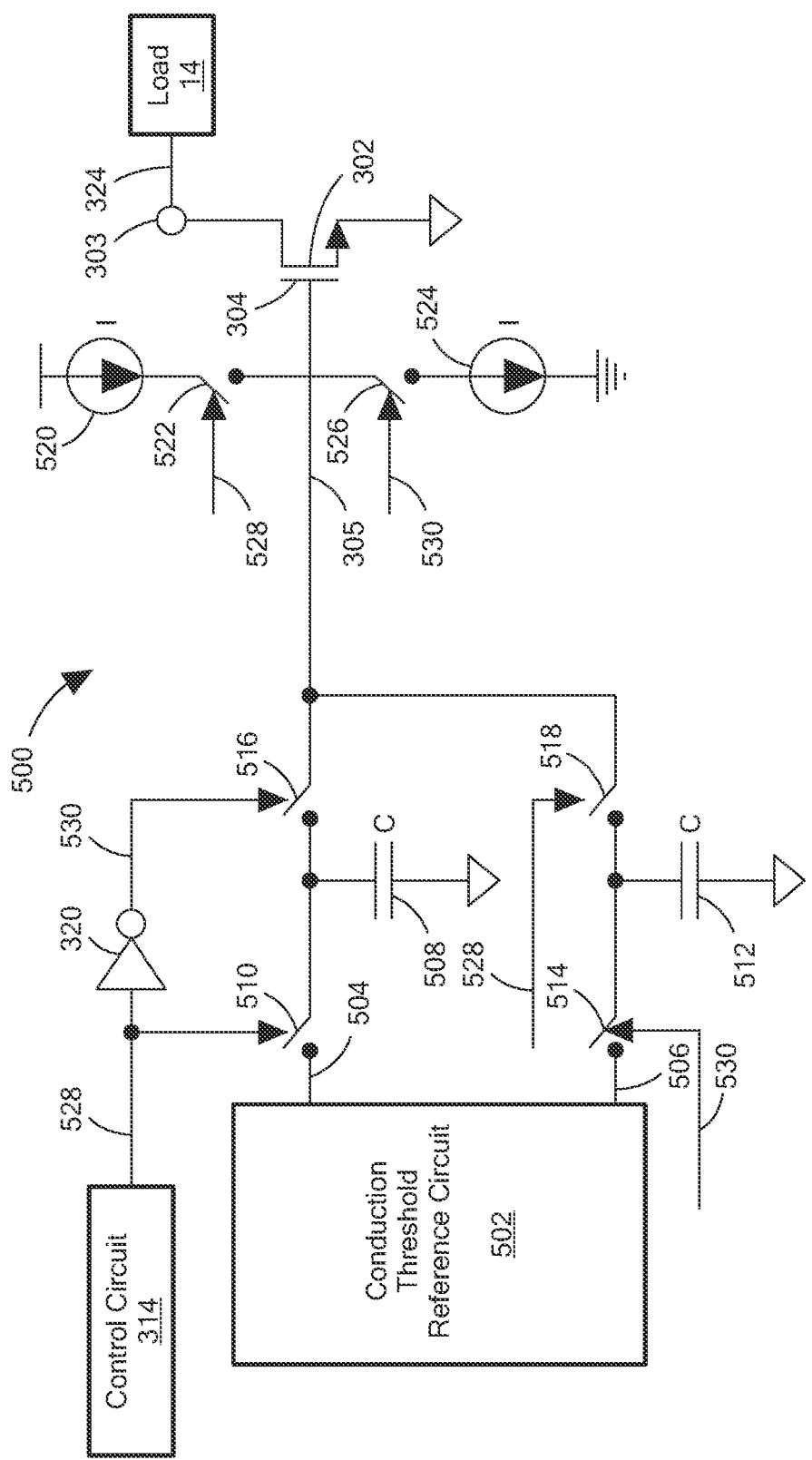
FIG. 5 is a schematic diagram of an embodiment of an output driver circuit.

FIG. 5 illustrates an embodiment of an electronic circuit 500 that can generate both the rising edge of the signal 305 shown in FIG. 4A and the falling edge of the signal 305 shown in FIG. 4B.

The electronic circuit 500 may include a conduction threshold reference circuit 502 that can produce a first reference voltage signal 504 for in generating a falling edge of the control signal 305 and a second reference voltage signal 506 for use in generating a rising edge of the control signal 305. The first reference voltage signal 504 may be the same as or similar to the reference voltage signal 323 described above in relation to FIG. 3. The second reference voltage signal 506 may be the same as or similar to the reference voltage signal 323B described above in relation to FIG. 3B.

The electronic circuit 500 may include a first capacitor 508 selectively coupled to the first voltage reference signal 504 via a switch 510, and a second capacitor 512 selectively coupled to the second voltage reference signal 506 via a switch 514. The capacitor 508 and the capacitor 512 may also be selectively coupled to the control terminal 304 via a switch 516 and a switch 518, respectively.

A current source 520 may be coupled to the control terminal 304 via a switch 522. The current source 520 may be the same as or similar to the current source 322 shown in FIG. 3. A current sink 524 may be coupled to the control terminal 304 via a switch 526. The current sink may be the same as or similar to the current sink 372 shown in FIG. 3B.

The control circuit 314 may be coupled to generate a control signal 528. The control signal 528 may be coupled to the switch 510, the switch 518, and the switch 522. The control signal 528 may operate to open and close the switches 528, 510, and 518.

The inverter 320 may be coupled to receive the control signal 528 and produce an inverted control signal 530. The inverted control signal 530 may be coupled to the switch 514, the switch 516, and the switch 526. The inverted control signal 530 may operate to open and close the switches 514, 516, and 526.

In operation, when the control signal 528 is asserted, the electronic circuit may generate a rising edge of the signal 305. The control signal 528 may close the switch 518 and the switch 522 to couple the capacitor 512 and the voltage source 520 to the control terminal 304. Prior to the switch 518 closing, the capacitor 512 may have been charged by the voltage reference signal 506 to a level associated with the conduction threshold of the switching device 302. The voltage reference signal 506 may charge the capacitor 512 to a level slightly lower than the conduction threshold of the switching device 302. This may allow the capacitor 512, when coupled to the control terminal 304, to bring the switching device to the verge of turning on.

When the switch 518 closes, the capacitor 512 may quickly ramp the voltage at the control terminal 304 up to the level associated with the conduction threshold at a first slew rate. Subsequently, the current source 520 may charge the capacitor 512 so that the signal 305 rises as a relatively slower rate and the switching device begins to conduct.

The control signal 528 may also close the switch 510 to couple the capacitor 508 to the voltage reference signal 504. The voltage reference signal 504 may provide a voltage associated with the conduction threshold of the switching device 302. In an embodiment, the voltage reference signal 504 provides a voltage that is slightly higher than the conduction threshold so that the capacitor 508, when coupled to the control terminal 304, may bring the switching device 302 to the verge of turning off.

When the control signal 528 is asserted, the inverted control signal 530 may open the switch 516 to decouple the capacitor 508 from the control terminal 304, open the switch 514 to decouple the capacitor 512 from the voltage reference signal 506, and open the switch 526 to decouple the current source 524 from the control terminal 304.

When the control signal 528 is de-asserted, the electronic circuit 500 may generate a falling edge of the signal 305. When de-asserted, the control signal 528 may open the switch 510 to decouple the capacitor 508 from the voltage reference signal 504, open the switch 518 to decouple the capacitor 512 from the control terminal 304, and open the switch 522 to decouple the current source 520 from the control terminal 304. Also, the inverted control signal 530 may close the switch 516 to couple the capacitor 508 to the control terminal 304, close the switch 526 to couple the current sink 524 to the control terminal 304, and close the switch 514 to couple the capacitor 512 to the voltage reference signal 506.

As described, the capacitor 508 may be charged to a level associated with (e.g. slightly higher than) the conduction threshold of the switching device 302. When the switch 516 closes, the capacitor 508 is coupled to the control terminal 304 and may quickly ramp the signal 305 to the level associated with the conduction threshold at a first slew rate. Subsequently, the current sink 524 may discharge the capacitor 508 so that the signal 305 falls at a relatively slower rate and the switching device 302 turns off.

Accordingly, when the control signal 528 is asserted, the electronic circuit 500 may cause the signal 305 to rise in a manner similar or the same as the signal 305 as shown in FIG. 4A. When the control signal 528 is de-asserted, the electronic circuit 500 may cause the signal 305 to fall in a manner similar or the same as the signal 305 as shown in FIG. 4B.

The embodiments discussed above are described as producing waveforms having two slew rates. One skilled in the art will recognize that other embodiments of the invention may produce waveforms having more than two slew rates. For example, a rising or falling waveform with three or more slew rates may be used to control a switching device. Additionally or alternatively, a rising or falling waveform having different slew rates depending upon whether the waveform is rising or falling, or different slew rates from one period to the next, may be used to control a switching device.

Figure 6:
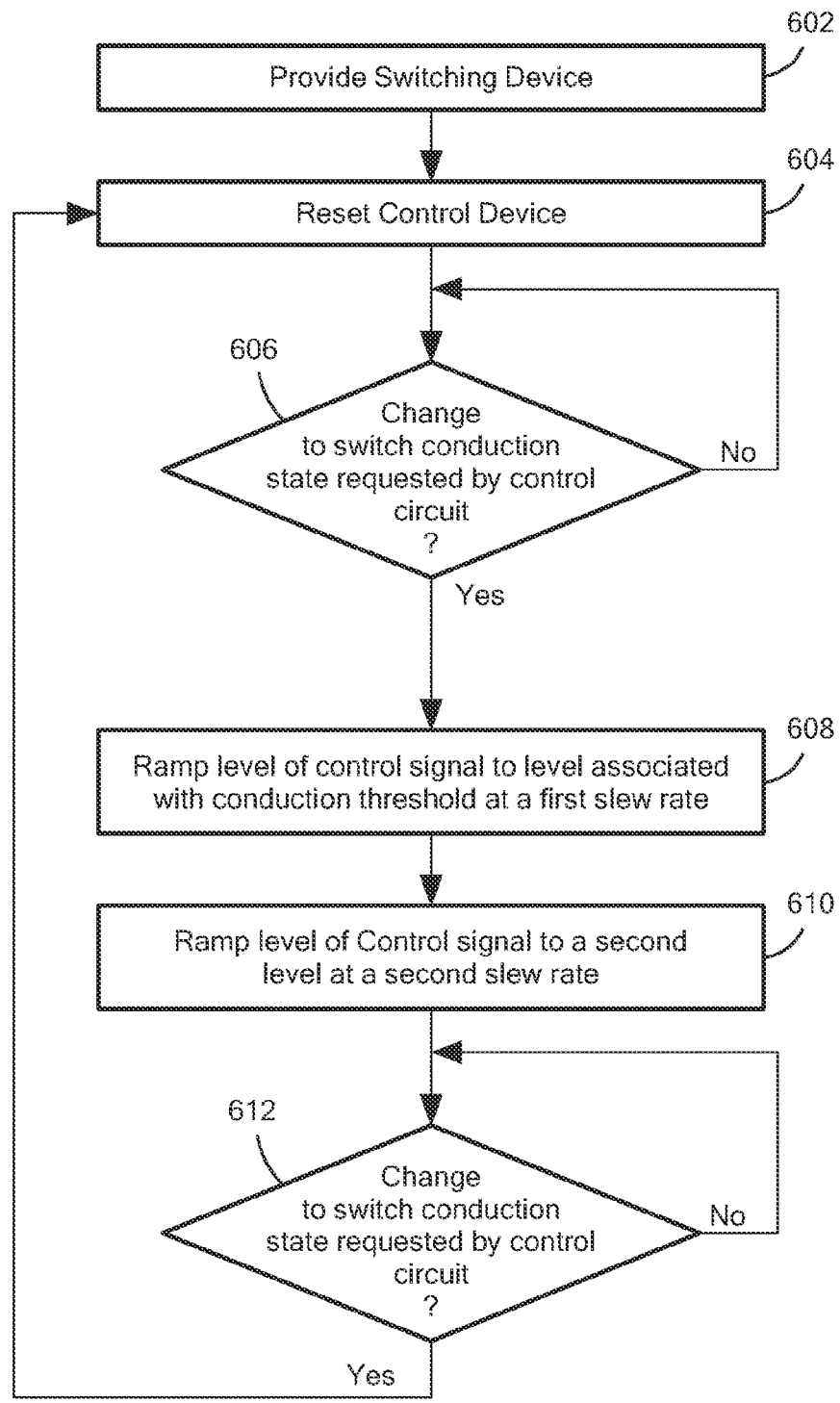
FIG. 6 is a flowchart illustrating a process 600 for driving a load.

FIG. 6 is a flowchart illustrating a process 600 for driving a load. In block 602 a switching device is provided for driving the load. In block 604 a switch control signal (e.g. signal 305 in FIG. 3) is reset. The control signal can be reset by pulling the signal to a voltage rail (e.g., by switch 374 pulling the signal to the voltage source 376 in FIG. 3B) or ground (e.g., by switch 316 in FIG. 3A). In block 606 the process 600 determines whether a control circuit has requested a change in the conduction state of the switching device. The control circuit (i.e. control circuit 314) may request a change in the conduction state by asserting or de-asserting the signal 316. If a change in the conduction state is requested, the process 600 may ramp the level of a switch control signal (i.e. the signal 305) to a level associated with the conduction threshold of the switching device at a first slew rate in block 608. (See, for example, FIGS. 4A and 4B between the times T0 and T1', or T0 and T1"). In an embodiment, if the process 600 is implemented by a magnetic sensor circuit, for example, a change in the control state may be requested when the sensor detects a magnetic target.

The process 600 may then ramp the level of the control signal to a second level at a second slew rate in block 610. (See, for example, FIGS. 4A and 4B after time T1 or after time T1"). In block 612 the process may check to see if a change in the conduction state of the switching device is requested by the control circuit. If a change in the switch conduction state is again requested, the process may proceed again to block 604. In an embodiment, if the process 600 is implemented by a magnetic sensor circuit, for example, a change in the control state may be requested when the sensor detects a magnetic target.

Although FIGS. 3, 3A, and 3B show the switching device as an n-channel FET and the load has been described as a pull-up circuit, alternate embodiments that utilize the invention are within the scope of this disclosure. For example, the n-channel FET can be replaced by a p-channel FET and the pull-up load circuit can be replaced with a pull-down load circuit. In embodiments, one or more inductors may be used in place of, or in conjunction with, the capacitor 306 (See FIGS. 3, 3A, and 3B) or the capacitors 508 and 512 (See FIG. 5). For example, the inductors can be charged to provide a current across a resistor. The resulting voltage across the resistor can be used to control the switching devices as described above. In other embodiments, RLC networks and LC combinations can be used to control the switching devices as described above.

Additionally, although the embodiments shown herein use the capacitor 306 and a current source to shape the signal 305, other methods can be used. For example, the signal 305 can be generated by a signal generator, or other circuits that can create rising and falling signals having a first and second slew rate as described above.

The signals described above are examples of signals that can be utilized in the invention. For example, if a particular signal is described as, say, a voltage signal, the signal can be replaced, in various embodiments, with any type of appropriate signal. Appropriate signals can include analog signals, digital signals, logic signals, voltage signals, current signals, transmission signals, etc.

In operation, the invention can be used to reduce radiated electrical emissions and reduce switching delays while driving a load.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An apparatus comprising:
   a switching device for driving a load, the switching device having a control terminal and a conduction threshold which, when crossed by a control signal coupled to the control terminal, causes the switching device to conduct;
   a control circuit for generating the control signal, the control signal having a first slew rate prior to the control signal crossing the conduction threshold and a second slew rate after the control signal has crossed the conduction threshold, wherein the first slew rate is faster than the second slew rate;
   an energy storage device selectively coupled to the control terminal of the switching device; and
   a conduction threshold reference circuit selectively coupled to the energy storage device to charge the energy storage device to a level associated with the conduction threshold.

2. The apparatus of claim 1 wherein the switching device is a transistor.

3. The apparatus of claim 2 wherein the transistor is a field-effect transistor.

4. The apparatus of claim 2 wherein the control terminal is a gate or base node of the transistor.

5. The apparatus of claim 1 wherein the conduction threshold is a voltage level.

6. The apparatus of claim 1 wherein the energy storage device is a capacitor.

7. The apparatus of claim 1 wherein the energy storage device is an inductor.

8. The apparatus of claim 1 wherein the conduction threshold reference circuit comprises a transistor configured to be biased to the level associated with the conduction threshold.

9. A driver circuit for an output transistor having a control terminal responsive to a control signal, comprising:
   a bias circuit including an energy storage device selectively coupled to the control terminal to increase the control signal to a level associated with a conduction level of the output transistor at a first rate when the bias circuit is coupled to the control terminal, and a conduction reference threshold circuit selectively coupled to the energy storage device to charge the energy storage device to a level associated with the conduction level; and
   a charging circuit for increasing the control signal beyond the conduction level at a second, slower rate when the bias circuit is decoupled from the control terminal.

10. The output transistor driver circuit of claim 9 wherein the bias circuit comprises a transistor of the same type as the output transistor.

11. A method comprising:
    providing a switching device for driving a load, the switching device having a control terminal and having a conduction threshold which, when crossed by a control signal coupled to the control terminal, causes the switching device to conduct;
    charging an energy storage device by coupling the energy storage device to a conduction reference threshold circuit that charges the energy storage device to a level associated with the conduction threshold;
    ramping the level of the control signal from a first level to a level associated with the conduction threshold at a first slew rate by coupling the energy storage device to the control terminal; and
    ramping the level of the control signal from the conduction threshold to a second level at a second slew rate, wherein the first slew rate is faster than the second slew rate.

12. The method of claim 11 wherein providing the switching device comprises providing a transistor.

13. The method of claim 12 wherein providing the transistor comprises providing a field-effect transistor.

14. The method of claim 12 wherein the control terminal is a gate or base node of the transistor.

15. The method of claim 11 wherein the conduction threshold, the first level, the second level, or a combination thereof are voltage levels.

16. The method of claim 11 wherein the energy storage device is a capacitor.

17. The method of claim 11 wherein the energy storage device is an inductor.

18. The method of claim 11 wherein ramping the level of the control signal from the conduction threshold to the second level comprises charging the energy storage device once the energy storage device has been coupled to the control terminal of the switching device.

19. The method of claim 11 wherein charging the energy storage device includes coupling the energy storage device to a transistor biased to the level associated with the conduction threshold.

\* \* \* \* \*

UNITED STATES PATENT AND TRADEMARK OFFICE
CERTIFICATE OF CORRECTION

PATENT NO. : 8,779,805 B1
APPLICATION NO. : 13/727149
DATED : July 15, 2014
INVENTOR(S) : Devon Fernandez et al.

Page 1 of 1

It is certified that error appears in the above-identified patent and that said Letters Patent is hereby corrected as shown below:

Specification

Column 5, line 40 delete "that that," and replace with -- that --

Column 9, line 7 delete "for in" and replace with -- for use in --

Column 9, line 57 delete "as" and replace with -- at --

Signed and Sealed this
Twentieth Day of October, 2015

Michelle K. Lee
*Director of the United States Patent and Trademark Office*